United States Patent [19]

Sweha et al.

[11] Patent Number: 5,497,354
[45] Date of Patent: Mar. 5, 1996

[54] BIT MAP ADDRESSING SCHEMES FOR FLASH MEMORY

[75] Inventors: Sherif Sweha, El Dorado Hills; Mark E. Bauer, Cameron Park, both of Calif.

[73] Assignee: Intel Corporation, Santa Clara, Calif.

[21] Appl. No.: 253,902

[22] Filed: Jun. 2, 1994

[51] Int. Cl.$^6$ .................................................. G11C 8/00
[52] U.S. Cl. ........................ 365/230.06; 365/207
[58] Field of Search ............................ 365/230.06, 207

[56] References Cited

U.S. PATENT DOCUMENTS

| | | | |
|---|---|---|---|
| 4,202,044 | 5/1980 | Beilstein, Jr. et al. | 365/182 |
| 4,287,570 | 9/1981 | Stark | 365/104 |
| 4,388,702 | 6/1983 | Sheppard | 365/104 |
| 4,415,992 | 11/1983 | Adlhoch | 365/94 |
| 4,586,163 | 4/1986 | Koike | 365/104 |
| 4,653,023 | 3/1987 | Suzuki et al. | 354/104 |
| 4,701,884 | 10/1987 | Aoki et al. | 365/189 |
| 4,771,404 | 9/1988 | Mano et al. | 365/189 |
| 5,012,448 | 4/1991 | Matsuoka et al. | 365/208 |
| 5,043,940 | 8/1991 | Harari | 365/168 |
| 5,163,021 | 11/1992 | Mehrotra et al. | 365/185 |
| 5,172,338 | 12/1992 | Mehrotra et al. | 365/185 |
| 5,297,148 | 3/1994 | Harari et al. | 371/10.2 |
| 5,351,210 | 9/1994 | Saito | 365/189.01 |
| 5,375,097 | 12/1994 | Reddy et al. | 365/230.06 |

*Primary Examiner*—Do Hyun Yoo
*Attorney, Agent, or Firm*—Blakely, Sokoloff, Taylor & Zafman

[57] ABSTRACT

Sense path and write path architectures for read and write accesses of a memory device having memory cells that store n binary bits are disclosed. "By-output" architectures provide one output per bit such that each selected memory cell is mapped to n outputs and the n bits stored in the selected memory cell are read in parallel. "By-address" architectures provide one address per bit such that each selected memory cell is mapped to one output, and the n bits stored in the selected memory cell are read sequentially.

4 Claims, 10 Drawing Sheets

FIG_1

BIT MAP ADDRESSING SCHEMES FOR FLASH MEMORY

FIELD OF THE INVENTION

The present invention relates generally to sense and write path architectures for a semiconductor memory device and specifically to sense and write path architectures for nonvolatile semiconductor memory devices that include memory cells that store more than a single bit of data.

BACKGROUND OF THE INVENTION

Nonvolatile semiconductor memory devices are fundamental building blocks in prior art computer system designs. The primary means by which data is stored in nonvolatile memory is the memory cell. Typical prior memory technologies provide a storage capacity of one bit, or two states, per cell. Nonvolatile memory cells that have more than two possible states are known to the prior art.

One type of prior nonvolatile semiconductor memory is the flash electrically-erasable programmable read-only memory ("flash EEPROM"). Prior art flash EEPROMs typically allow for the simultaneous reading of several flash cells. Further, typical prior flash EEPROMs have a storage capacity that is much greater than the amount of data that can be output at any one time. Accordingly, each output of a flash EEPROM is typically associated with an array of flash cells that is arranged into rows and columns, where each flash cell in an array is uniquely addressable. When a user provides an address, row and column decoding logic in the flash EEPROM selects the corresponding flash cell. If more than one output is provided, the array is typically subdivided into equal-sized data blocks containing a subset of the number of columns in the array. For example, in a sixteen output flash device containing 512 k flash cells arranged in 1024 rows and 512 columns, each of the sixteen data blocks contains 32 columns by 1024 rows of flash cells.

One type of prior flash cell is a field effect transistor (FET) that includes a select gate, a floating gate, a drain and a source. For read operations, the source of the flash cell is coupled to ground, and the drain of the flash cell is coupled to a bitline of the array. The flash cell is switched on and off by applying a select voltage to the select gate via a wordline that is coupled to the select gate. The extent to which the flash cell conducts current when the select voltage is applied is determined by the threshold voltage $V_t$ of the flash cell, which can be increased by trapping electrons on the floating gate. A typical method for storing information in a flash cell requires the trapping of excess electrons on the floating gate to increase the $V_t$ of the flash cell such that the current conducted by the memory cell is reduced when the select voltage is applied to the select gate. If the cell current is less than a reference current when the select voltage is applied, the flash cell is said to be "programmed." If the cell current is greater than the reference current when the select voltage is applied, the flash cell is said to be "erased." As the typical prior art flash cell is configured to be in one of two possible states, programmed or erased, the typical prior art flash cell is said to store one bit of data.

Typical prior art schemes for accessing data stored in a flash cell are therefore based on the premise that each cell stores a single bit of data. In such prior schemes, one output is provided for each selected cell, and addressing a particular memory cell is the same as addressing the data bit stored in the memory cell. When the memory cell stores two or more bits of data, however, the prior art sense path architectures for single bit cells are inadequate because each memory cell address specifies more than a single bit. A sense path architecture is therefore needed to access each bit of information stored in a memory cell that stores n bits of data. Similarly, a write path architecture is needed to write n bits of data per memory cell.

SUMMARY AND OBJECTS OF THE INVENTION

Therefore, one object of the present invention is to provide a sense path architecture for accessing each bit of a memory cell that stores n bits per cell.

Another object of the present invention is to provide a write path architecture for writing data to a memory cell that stores n bits per cell.

These and other objects are provided by a sense path circuit for accessing data stored in a selected memory cell that stores at least two binary bits of data. The sense path circuit includes a plurality of outputs equal in number to the n bits stored in the selected cell. The sense path circuit also includes a sensing circuit that is coupled to the selected memory cell and to each of the outputs for determining a state for each of the n bits stored in the selected memory cell and for outputting each of the n bits to a corresponding one of the plurality of outputs. A corresponding write path circuit is also disclosed.

A second embodiment provides for the objects of the invention by sense path circuit for accessing data stored in a selected memory cell that stores at least two binary bits of data. The sense path circuit includes a single output and a plurality of latches equal in number to the number of bits stored in the selected memory cell. The sense path circuit also includes a sensing circuit that is coupled to the selected memory cell and to each latch for determining a state for each of the n bits stored in the selected memory cell. A switching circuit selectively and sequentially couples the output of each latch to the output such that data stored in the selected memory cell is output over n consecutive clock cycles. A corresponding write path circuit is also disclosed.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

For the purposes of illustration, the memory device discussed in relation to the figures is assumed to be a sixteen output flash EEPROM having a 512 k flash cell array. The array is arranged in 1024 rows and 512 columns, which are subdivided into sixteen data blocks of equal size having 1024 rows and 32 columns each. Components that are common to each embodiment are labeled similarly in order to avoid confusion. This example is not exhaustive of the memory devices in which the method and apparatus of the present invention can be implemented.

Figure 1:
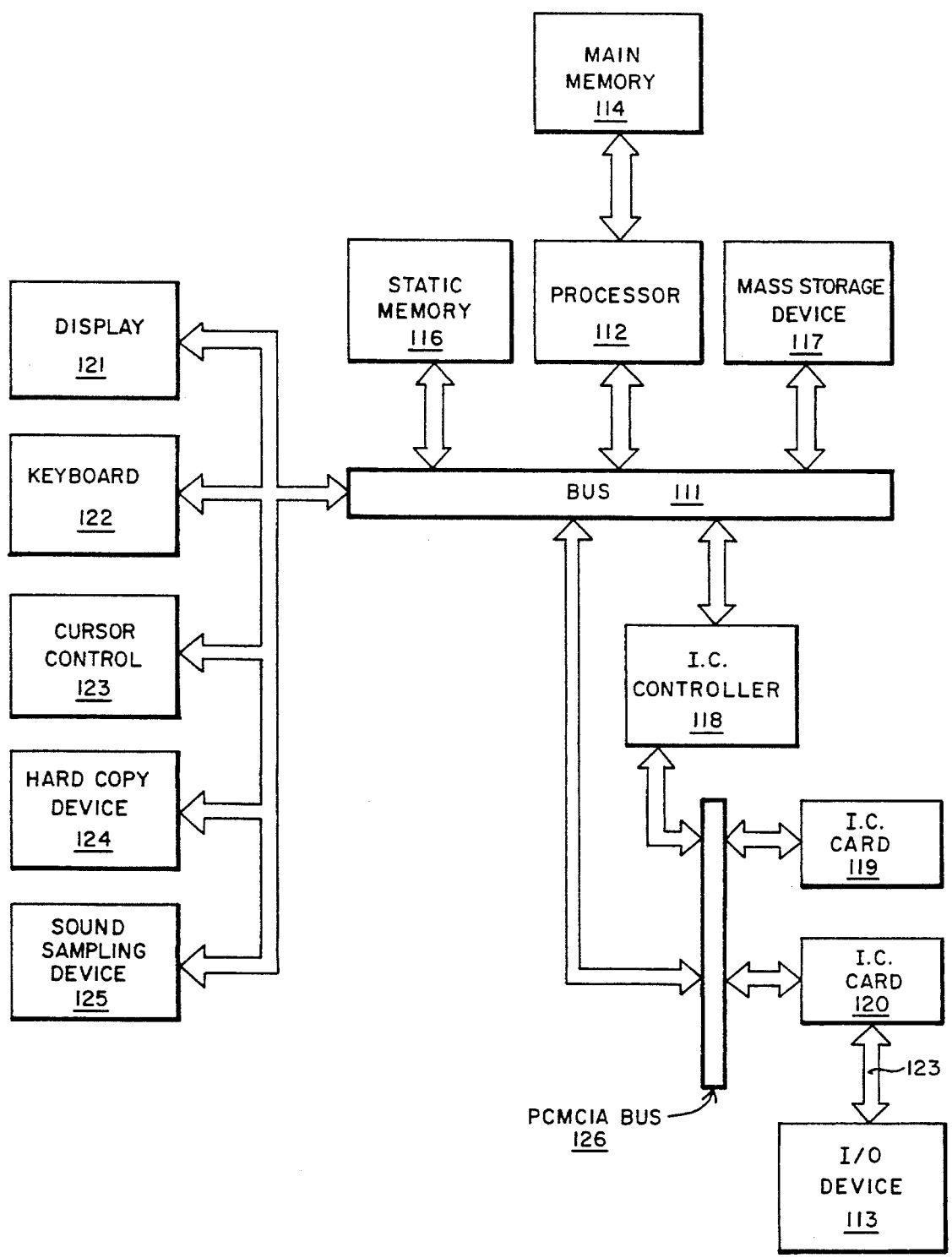
FIG. 1 shows a computer system according to one embodiment.

FIG. 1 shows a computer system of one embodiment. The computer system generally includes a bus 111, to which may be coupled a processor 112, main memory 114, static memory 116, mass storage device 117, and integrated circuit controller 118. Static memory 116 may include a flash electrically eraseable programmable read only memory ("flash EEPROM") or other nonvolatile memory device that stores multiple bits of data per cell. Similarly, mass storage device 117 may be a solid state hard drive 117 using multiple bit per cell nonvolatile memory devices for storing data.

Integrated circuit cards 119 and 120 may be included in the computer system and are coupled to a Personal Computer Memory Card Industry (PCMCIA) bus 126. PCMCIA bus 126 is coupled to bus 111 and to integrated circuit (IC) controller 118 for providing communication information between cards 119 and 120 and the remainder of the computer system. IC controller 118 provides control and address information to IC cards 119 and 120 via PCMCIA bus 126 and is coupled to bus 111.

The computer system may further include a display device 121, a keyboard 122, a cursor control device 123, a hard copy device 124, and a sound sampling device 125. The specific components and configuration of the computer system is determined by the particular applications for which the computer system is to be used. For example, the computer system of FIG. 1. may be a personal digital assistant (PDA), a pen-based computer system, a mainframe computer, or a personal computer.

Figure 2:
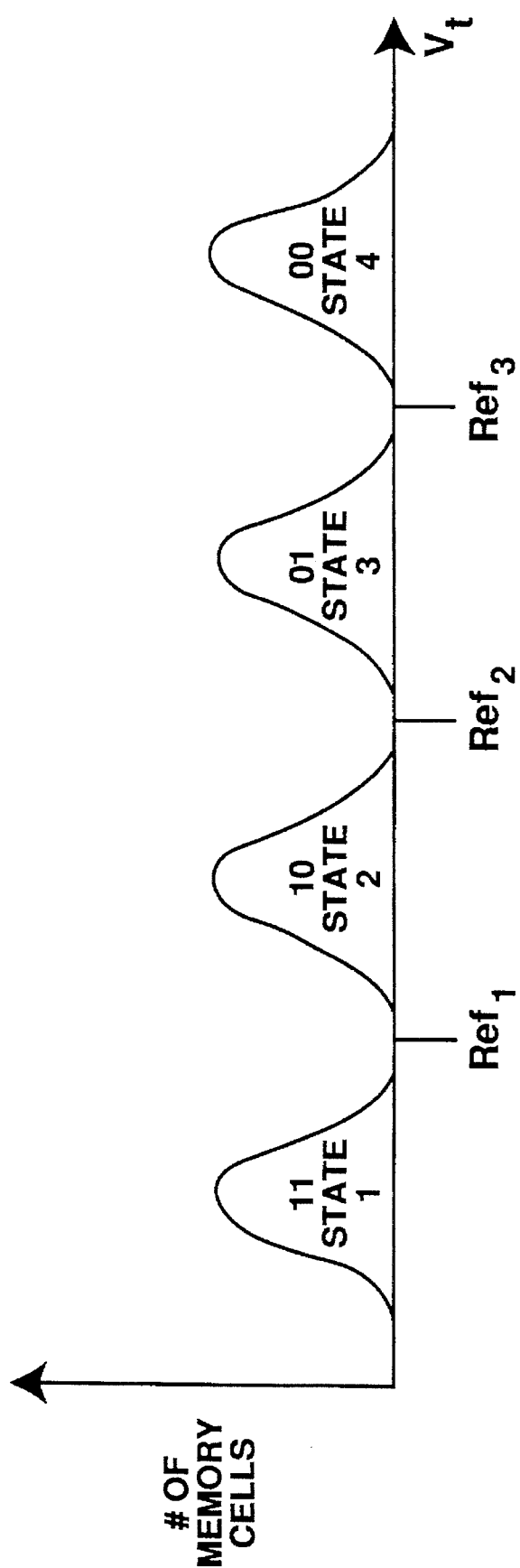
FIG. 2 shows a distribution of multi-level flash cells as a function of $V_t$.

For each embodiment, each memory cell is a flash cell. Each flash cell in the array is capable of being in one of four analog states, and the state of the flash cell is indicated by two binary bits. FIG. 2 shows a distribution of multi-level flash cells as a function of threshold voltage $V_t$. As can be seen, each state is separated by a separation range, and three references, $Ref_1$, $Ref_2$ and $Ref_3$, are provided, one each from the three separation ranges. The references are provided to distinguish between the analog states. State 1 encompasses the lowest range of $V_t$ voltages of the four states and is indicated by both bits being logic 1's (both erased). State 2 is indicated when the high order bit (Bit 1) is a logic 1 and the lower order bit (Bit 0) is a logic 0. State 3 is indicated by Bit 1 being a logic 0 and Bit 0 being a logic 1. State 4 is indicated by both bits being logic 0's (both programmed). The number n of possible states is not limited to four. For example, the number of states can be three, five, sixteen, etc. Further, the mapping of binary bits to analog states may be varied. For example, the lowest range of $V_t$ voltages can be indicated by both bits being logic 0's.

It should be noted that nonvolatile memory devices other than flash EEPROM's and volatile memory devices such as Dynamic Random Access Memories (DRAM) are potentially capable of storing three or more analog states. Further, it should be noted that the analog states of nonvolatile devices having a floating gate may be expressed in terms other than the threshold voltage $V_t$. For example, analog states may be expressed as ranges of threshold voltages $V_t$ as shown in FIG. 2, as ranges of drain currents $I_D$, or as ranges of charge stored on the floating gate. Volatile memory cells such as DRAM memory cells are typically comprised of a capacitor and may similarly be expressed as ranges of charge, currents or voltages.

A nonvolatile memory cell that has a floating gate behaves as a field effect transistor having a threshold voltage $V_t$ that increases as charge is added to the floating gate. The memory cell drain current $I_D$ ("cell current") decreases as the threshold voltage Vt and cell charge level increase. The memory cell threshold voltage $V_t$ is related to the memory cell drain current $I_D$ by the expression:

$$I_D \alpha G_m \times (V_G - V_t) \text{ for } V_D > V_G - V_t$$

$G_m$ is the transconductance of the memory cell;

$V_G$ is the memory cell gate voltage;

$V_D$ is the memory cell drain voltage; and $V_t$ is the memory cell threshold voltage.

Given this relationship, there are a number of ways to sense the amount of charge stored on of the floating gate of the memory cell, including the following: sensing the cell current of a memory cell when a constant voltage is applied to the select gate of the memory cell; sensing the amount of voltage required at the select gate to give rise to an expected cell current for the memory cell; sensing a voltage drop across a load that is coupled to the drain of the memory cell when a constant voltage is applied to the select gate of the memory cell, wherein the cell current determines the amount of the voltage drop across the load; and sensing the amount of voltage required at the select gate to give rise to an expected voltage drop across a load that is coupled to the drain of the memory cell. To determine the analog state of the memory cell, however, it is not necessary to quantify the precise amount of charge stored on the floating gate. It is sufficient to compare a characteristic of the memory cell to a known reference.

One type of reference is a reference memory cell programmed to have a known threshold voltage $V_t$ that is typically between defined states. Sensing circuitry for the memory cell may be replicated for the reference memory cell and the outputs of the sensing circuitry and reference sensing circuitry may be compared using a differential comparator. Because sensing the cell charge level of a memory cell typically requires the comparison of either voltages or currents, the reference may be provided by using voltage supplies or current sources to supply voltages or currents that correspond to reference memory cells having a cell charge level between defined analog states. For this reason, the references $Ref_1$, $Ref_2$, and $Ref_3$ are not specified as being threshold voltages, cell currents, or levels of charge stored on a floating gate. Instead, it is to be understood that the references shown in FIG. 2 correspond to the characteristics of the memory cell as defined by the relationship between cell charge level, cell current $I_D$, and threshold voltage $V_t$. For the purposes of simplifying the remaining discussion, the references $Ref_1$, $Ref_2$, and $Ref_3$ will expressed as threshold voltages $V_{R1}$, $V_{R2}$ and $V_{R3}$, respectively.

Figure 3:
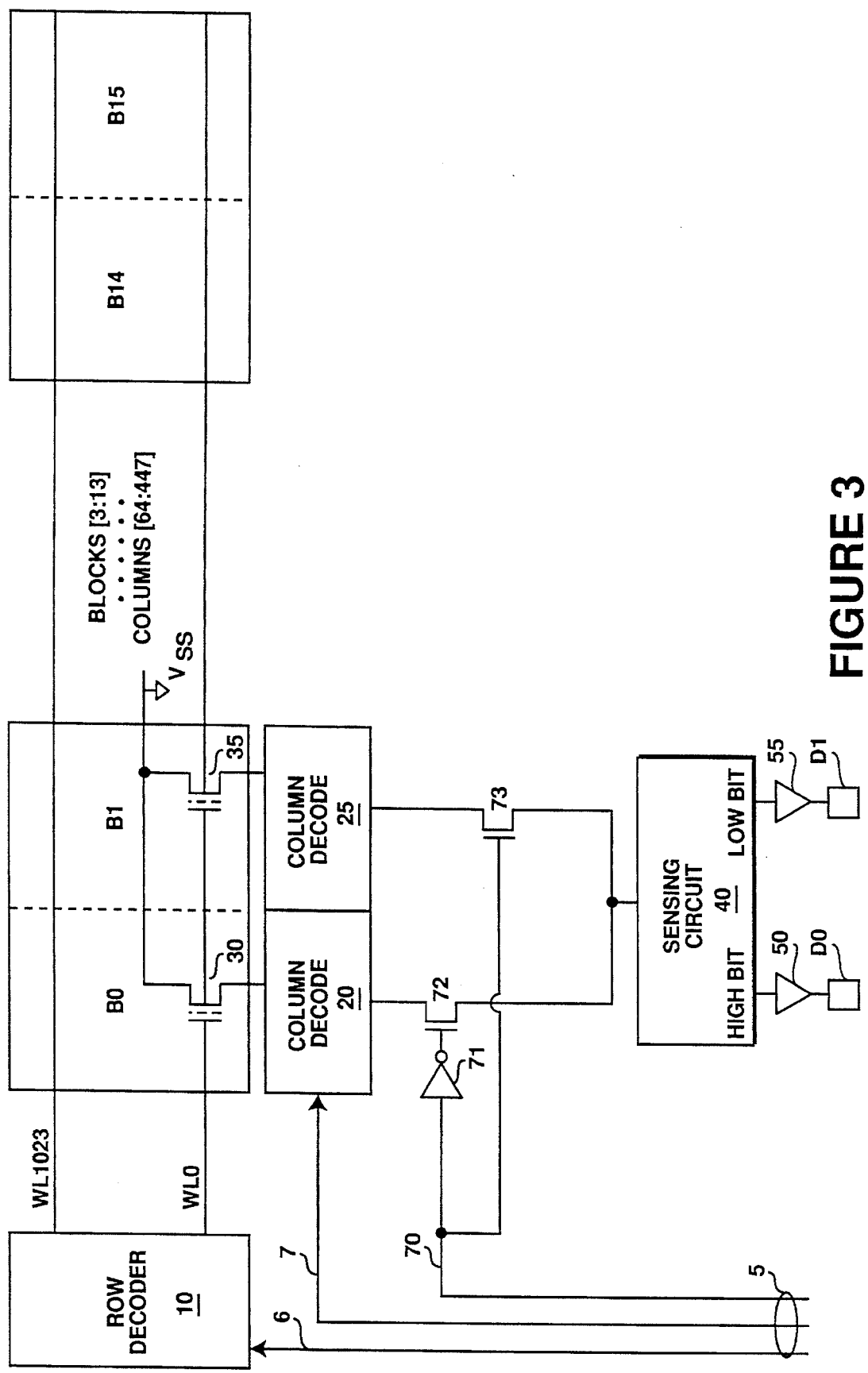
FIG. 3 illustrates a by-output sense path architecture according to a first embodiment.

FIG. 3 illustrates a by-output sense path architecture according to a first embodiment. The by-output sense path architecture of the first embodiment is designed to allow accessing of the n bits contained in a selected flash cell in a single clock cycle. The sense path architecture is said to be "by-output" because each bit in a cell is mapped to a unique output. Although FIG. 3 illustrates a sense path architecture for the case where two bits are stored per cell, the architecture may be readily adapted to provide the accessing of flash cells that store n bits.

In this sense path architecture, n outputs are provided per selected flash cell. In this manner, one address is used to select a single cell. The address is provided by address lines 5, which include row address lines 6 and column address lines 7. The address line 5 also include a MLC address line 70, which is described in more detail below. The mapping between data blocks and outputs, however, is changed from a one-to-one correspondence. In the example of FIG. 3, there are 16 data blocks, B0–B15, only eight of which are coupled to the sixteen outputs, D0–D15, at any one time.

For a two-bit per cell array, if the number of a flash cells in the array is to remain at 512 k such that the increased density of the dual-bit flash array is fully utilized, one extra address line is preferably added over the number of address lines typically required for accessing single-bit flash cell arrays. The number of address lines that must be added is a function of the increased memory space provided by the multi-bit cell. For every doubling of memory space, or portion thereof, one address line is preferably added. For odd numbers of bits, such as three bits per cell, the added address line results in the address space being larger than the accessible memory space. Thus, a four-bit per cell array would have the same number of address lines as the three-bit per cell array, but the address space and the memory space would be co-extensive. If the size of the array is halved in order to reduce the size of a typical 512 k flash memory device, no additional address line is required for a dual-bit flash cell array.

In this example, the floating gate of each selected flash cell is programmed such that each selected flash cell has a threshold voltage $V_t$ and a cell current that correspond to one of four possible states, which can be expressed using two binary bits. The state of a floating gate can be determined using a constant-select-voltage/variable cell current sensing scheme where a constant and predetermined select voltage is applied to the select gate of a flash cell each time the flash cell is read. The state of the flash cell is determined by comparing the cell current of the flash cell to the cell current of a reference cell (not shown) when the same select voltage is applied to the flash cell and the reference cell. As discussed above, the threshold voltages $V_t$ of the flash cell determines the cell current of the flash cell when the select voltage is applied to the select gate.

In FIG. 3, the user provides an address via address lines 5 that the row decoder 10 and the column decoders, which include column decoders 20 and 25, decode to select sixteen flash cells, one each from data blocks B0 to B15. Address decoding is performed as is well-known in the art. The state of MLC address line 70 determines which eight flash cells will be coupled to the sixteen outputs. Selected flash cells 30 and 35 are two of the sixteen flash cells selected in response to the address decoding operation of the row and column decoders. Flash cell 30 is selected in data block B0. Flash cell 35 is selected in data block B1. The drains of the selected flash cells 30 and 35 are coupled to the sense path circuit via column decoders 20 and 25, respectively.

The by-output sense path circuit includes a circuit for selecting between the selected flash cells 30 and 35 in response to the address bit of the MLC address line 70, a sensing circuit 40 that senses the state of the finally selected flash cell and outputs two binary bits indicating that state, and output buffers 50 and 55, each of which outputs one of the binary bits to the output of the memory device. The circuit for selecting between the selected flash cells 30 and 35 includes inverter 71, and n-channel FETs 72 and 73.

For the first embodiment, the state of the added address line determines whether the high word of the array, which is the sixteen bits stored in the odd-numbered data blocks B1–B15, or the low word of the array, which is the sixteen bits stored in the even-numbered data blocks, B0–B14, is routed to the outputs of the memory device. The added address line is shown as MLC address line 70, which is coupled to the input of inverter 71 and the gate of n-channel FET 73. When the address bit is a logic 0, the inverter 71 presents a logic 1 to the gate of n-channel FET 72. FET 72 switches on, coupling the sensing circuitry 40 to the column decode 20 of the data block B0, which stores two bits of the low word. When the address bit is logic 1 the sensing circuit 40 is coupled to the column decode 25 of the data block B1, which stores two bits of the high word. The MLC address line 70 is coupled to similar circuitry for the remaining pairs of data blocks such that a total of eight flash cells are selected from eight data blocks to output sixteen bits of data. One alternative to the present embodiment is to subdivide the array into eight data blocks each having 64 columns. The added address line can then be incorporated in the column decode circuitry. In this manner, the column decode circuitry directly selects the desired flash cell without resorting to an additional selecting circuit such as that which includes inverter 71 and FETs 72 and 73.

When the address bit of MLC address line 70 is a logic 0, the flash cell 30 is coupled to the sensing circuit 40. For a read access, the sensing is preferably performed using a binary search sensing scheme as described below with reference to FIGS. 4A and 4B. The sensing circuit outputs the high order bit Bit 1 to the output buffer 50 and the low order bit Bit 0 to the output buffer 55. The output buffers 50 and 55 output the data to outputs D0 and D1, respectively. The specific mappings of bits to outputs is not limited to contiguous outputs and can be determined according to the needs of the system. For example, the high order bit Bit 1 can be routed to output D0 and the low order bit B0 can be routed to output D7.

Figure 4A:
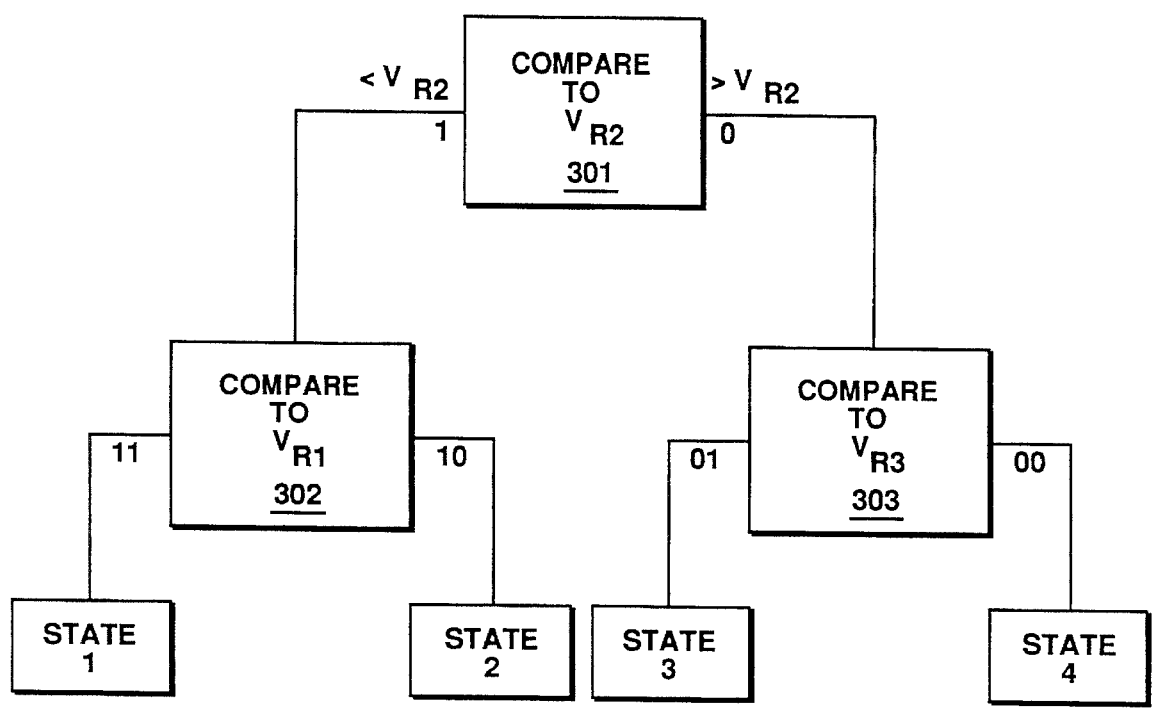
FIG. 4A is a flow chart for a binary search sensing scheme.

FIG. 4A is a block diagram showing a binary search method for determining the state of a memory cell having more than two possible states. In step 301, the cell charge level of the selected cell is sensed and compared to a first reference flash cell having its $V_t$ equal to $V_{R2}$. Depending on the result of the initial comparison, the sensed cell charge level of the selected cell is compared to a selected one of a second reference flash cell having its $V_t$ equal to $V_{R1}$ and a third reference flash cell having its $V_t$ equal to $V_{R3}$. If the sensed cell charge level of the selected flash is less than that of the first reference flash cell, the sensed cell charge level is compared to the second reference flash cell at step 2, and the selected flash cell is either in state 1 or state 302. If the sensed cell charge level of the selected flash is greater than that of the first reference flash cell, the sensed cell charge level is compared to the third reference flash cell at step 303, and the selected flash cell is either in state 3 or state 4. Sensing of the cell charge level may be done according to any of the methods previously discussed.

Figure 4B:
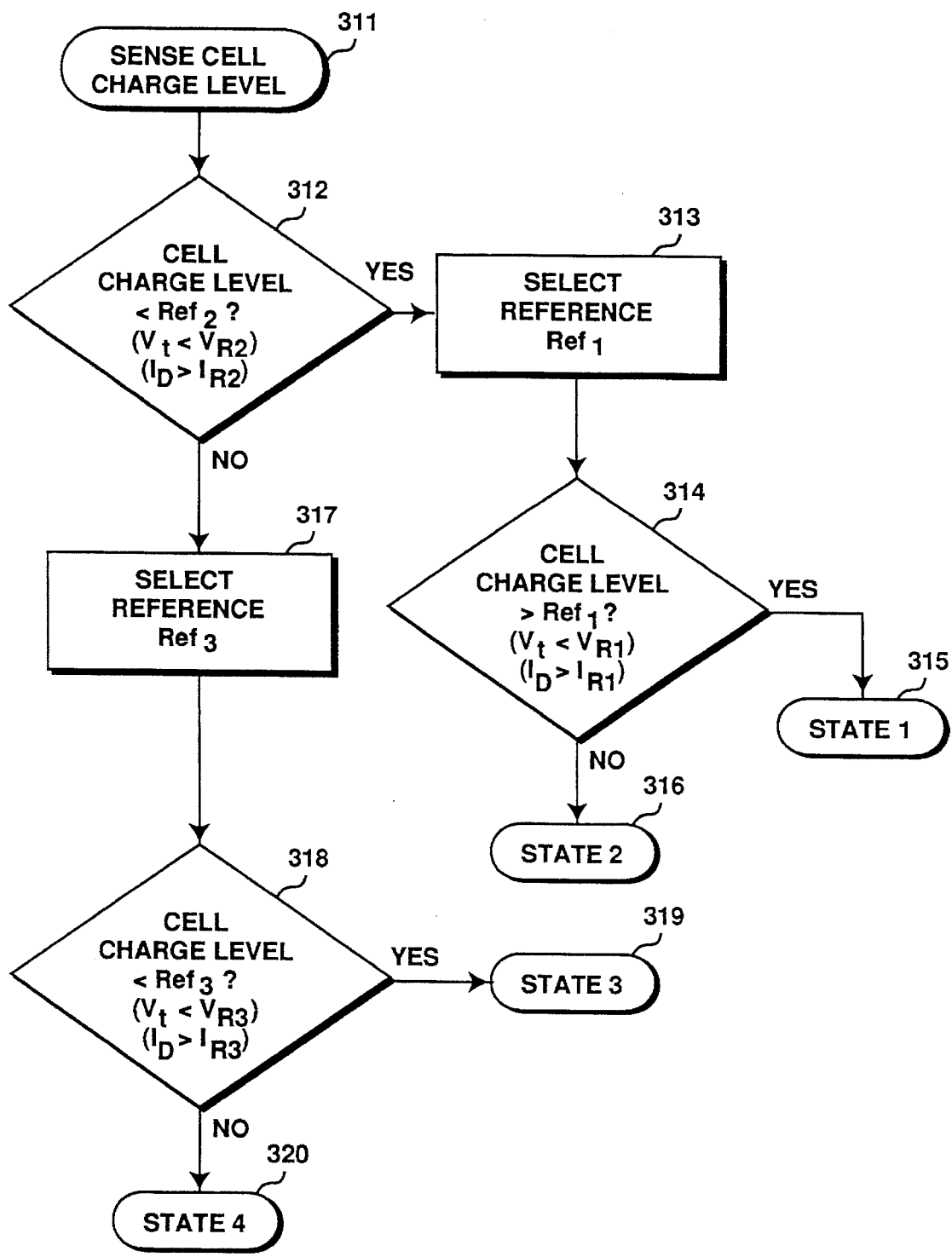
FIG. 4B is a more conventional flow chart for a binary search sensing scheme.

FIG. 4B is a conventional flow chart showing the binary search method of the present embodiment. At step 311, the cell charge level of the memory cell is sensed. At step 312, it is determined whether the cell charge of the memory cell is less than the cell charge level of the reference $Ref_2$. If the cell charge level of the memory cell is less than the cell charge level of the reference $Ref_2$, the threshold voltage $V_t$ of the memory cell is less than that of a reference memory cell having a $V_t$ equal to $V_{R2}$. Similarly, the cell current $I_D$ of the memory cell is greater than the cell current $I_{R2}$ of a reference memory cell having a cell current of $I_{R2}$. If the cell charge level of the memory cell is less than the cell charge level of reference Ref2, Ref1 is selected at step 313. At step 314, it is determined whether the cell charge of the memory cell is less than the cell charge level of the reference $Ref_1$. If the cell charge level of the memory cell is less than the cell charge level of the reference $Ref_1$, the memory cell is indicated as being in state 1 at step 315. If the cell charge level of the memory cell is greater than the cell charge level of the reference $Ref_1$, the memory cell is indicated as being in state 2 at step 316.

If the cell charge level of the memory cell is less than the cell charge level of reference $Ref_2$, $Ref_3$ is selected at step 317. At step 318, it is determined whether the cell charge of the memory cell is less than the cell charge level of the reference $Ref_3$. If the cell charge level of the memory cell is less than the cell charge level of the reference $Ref_3$, the memory cell is indicated as being in state 3 at step 319. If the cell charge level of the memory cell is greater than the cell charge level of the reference $Ref_3$, the memory cell is indicated as being in state 4 at step 320.

Figure 5:
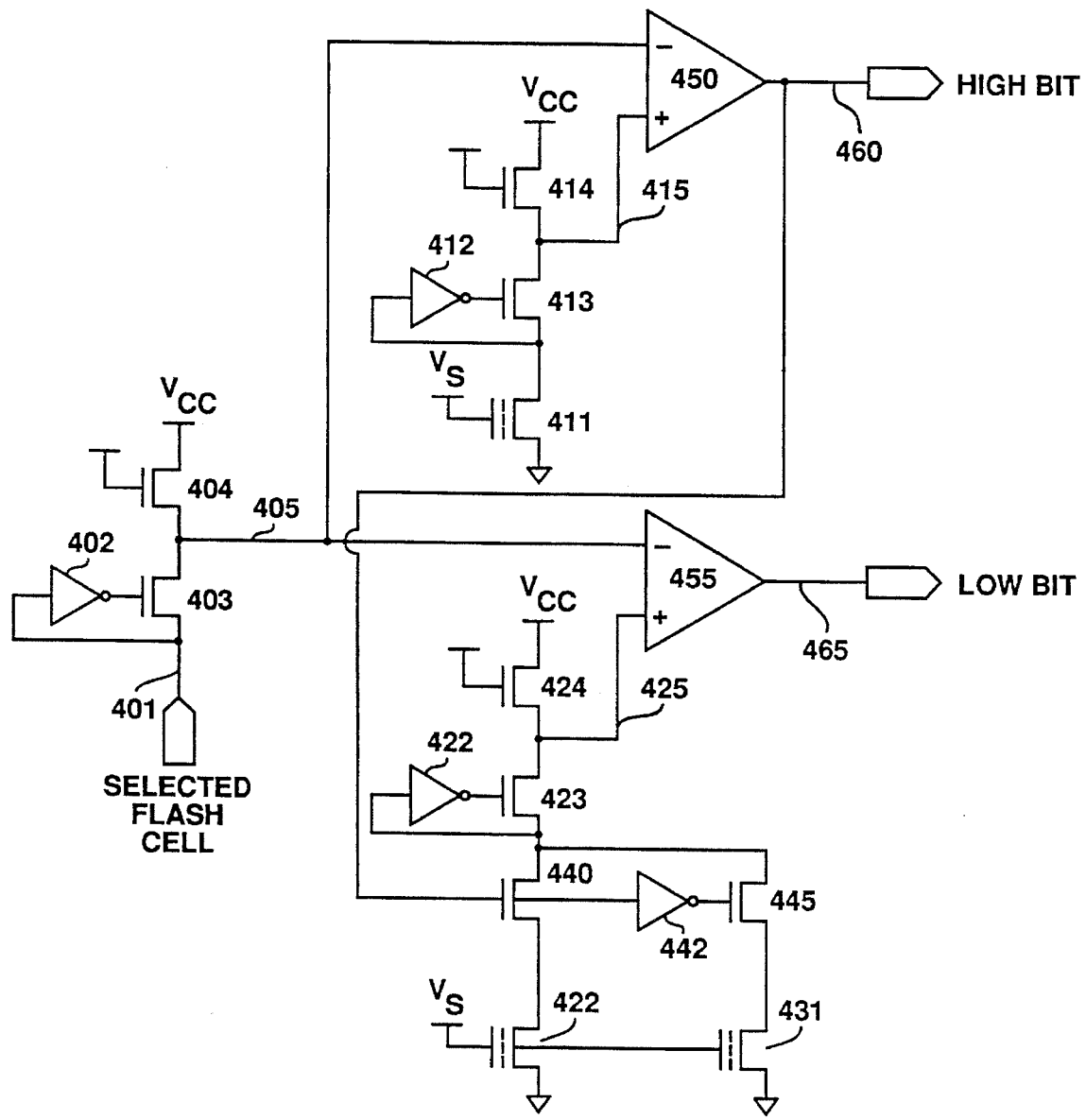
FIG. 5 illustrates a sensing circuit that implements a binary search scheme for sensing the state of a flash cell having four possible states.

FIG. 5 illustrates a sensing circuit that implements a binary search scheme for sensing the state of a flash cell having four possible states. The selected flash cell (as shown in FIG. 3) is coupled to the source of n-channel FET 403. The input of inverter 402 is coupled to the source of FET 403 while the output of the inverter is coupled to the gate of FET 403 such that FET 403 and inverter 402 together act as a drain bias circuit for biasing the drain of the selected flash cell and for isolating the selected flash cell from the column load, which is the n-channel FET 404 coupled to the drain of FET 403. The column load FET 404 is coupled to operate as a pull-up resistive device. Alternatively, a resistor may be used as the column load in place of FET 404.

The state of the selected flash cell determines the voltage at node 405, which is the drain of FET 403. The negative terminals of differential comparators 450 and 455 are both coupled to node 405 for sensing the voltage resulting from applying the biasing voltage to the select gate of the selected flash cell. Comparator 450 has its positive terminal coupled to a first reference circuit that includes a column load FET 414, a drain bias circuit including inverter 412 and FET 413, and a first reference flash cell 411 having its $V_t$ equal to $V_{R2}$. The voltage at node 415 is determined by the cell current of the first reference flash cell 411. The positive terminal of comparator 455, by contrast, is coupled to a second reference circuit in which the column load FET 424 and the drain bias FET 423 are selectively coupled to either a second reference cell 422, having its $V_t$ equal to $V_{R1}$, or a third reference cell 432, having its $V_t$ equal to $V_{R3}$. The selection between the second and third reference cells is made by a selector circuit in response to the output of comparator 450. The column load FETs 414 and 424 of the reference circuits are preferably identical to the column bias FET 404. Similarly, the drain bias circuits are preferably identical.

The selector circuit includes a first n-channel FET 440 having its drain coupled to the source of FET 423 and its source coupled to the second reference flash cell 422, and a second n-channel FET 445 having its drain coupled to the source of FET 423 and its source coupled to the third reference flash cell 431. The output signal line 460 is coupled to the gate of first FET 440. The output signal line 460 is also coupled to the gate of the second FET 445 via inverter 442. If the output of the first comparator 450 is a logic 1, indicating that the selected flash cell has a lower $V_t$ than the first reference flash cell 441, the first FET 440 is switched on and the voltage at node 425 is determined by the second reference flash cell 422. If the output signal of the first comparator 450 is a logic 0, the inverter 442 inverts the output signal to switch the FET 445 on, and the voltage at node 425 is determined by the third reference flash cell 431. The second comparator 455 outputs the result of the second comparison via output signal line 465. The output signal line 460 outputs the high order Bit 1 and the output signal line 465 outputs the low order Bit 0. The sensing scheme implemented by the sensing circuit need not be a binary search scheme. For example, the sensing scheme can simultaneously compare the sensed voltage of the selected flash cell to each reference cell.

Figure 6:
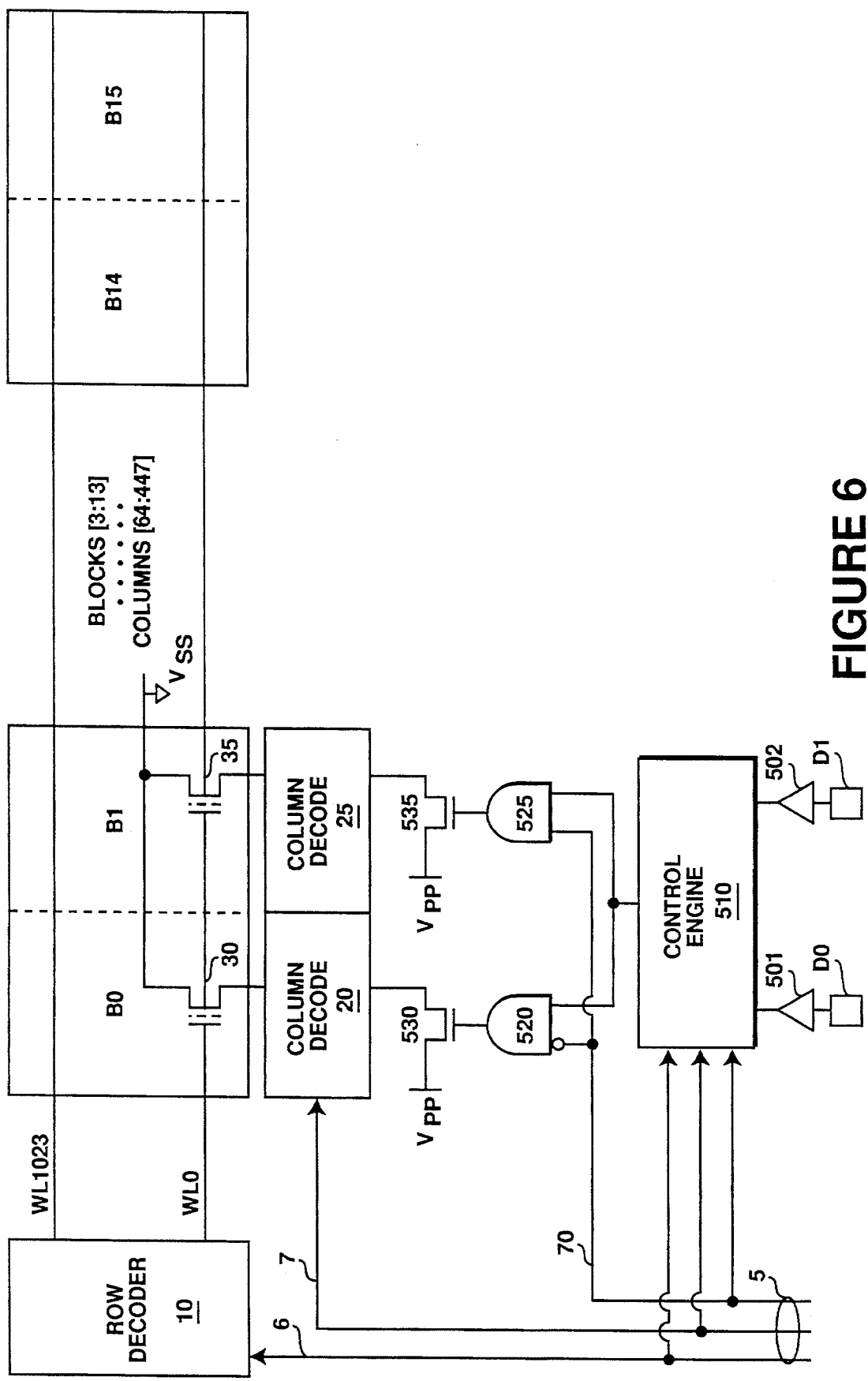
FIG. 6 shows a by-output write path architecture.

FIG. 6 shows a by-output write path architecture. The drains of the selected flash cells 30 and 35 are coupled to the write path circuit via column decoders 20 and 25, respectively. Addresses for cells to be programmed are provided via address lines 5. The by-output write path circuit includes FETs 530 and 535, AND gates 520 and 525, and control engine 510. Control engine 510 controls the erasure and programming of flash array. Control engine 510 manages the flash array via control of row decoder 10, column decoders 20 and 25, sensing circuit 40, an array of reference cells (as shown in FIG. 5) and voltage switch circuitry (not shown). The voltage switch circuitry controls the various voltage levels necessary to read, program and erase flash array. VPP is the program/erase voltage, which must be high in order to program or erase data stored within the flash array. VPP may be externally supplied or internally generated. User commands for reading, erasure, and programming are communicated to control engine 510 via a command interface (not shown). The control engine 510 may be a processor or state machine that is internal to the memory device, but the function of the control engine can be performed by control circuitry external to the memory device. A similar write path circuit is provided for every n outputs.

Each of the FETs 530 and 535 has its drain coupled to the programming voltage supply VPP and its source coupled to the respective selected flash cell via the appropriate drain path for each data block. When a logic high voltage is received at the gate of FETs 530 or 535, the drain path of the respective selected flash cell is coupled to the programming voltage supply VPP. The FETs 530 and 535 thus act as a selector circuit for selecting which selected flash cell to program. Voltage switching circuitry (not shown) uses the programming voltage supply to provide programming voltage levels to the selected flash cell. Typically, twelve volts are applied to the select gate, from six to seven volts are applied to the drain, and the source is grounded for the duration of a programming pulse. The voltage levels applied to the gates of FETs 530 and 535 are determined by AND gates 520 and 525 in response to the address bit of MLC address line 70 and the output of the control engine 510.

TABLE 1

| EXTERNAL DATA | | |
|---|---|---|
| Bit 1 | Bit 0 | STATE |
| 1 | 1 | STATE 1 |
| 1 | 0 | STATE 2 |
| 0 | 1 | STATE 3 |
| 0 | 0 | STATE 4 |

For a write access, every two external bits are coded into one of four programming levels that correspond to each of the four possible states by the control engine 510. This encoding may be done according to the truth table of Table 1. The programming level is then used to set the threshold voltage $V_t$ of a selected flash cell. The primary mechanism for placing charge on the floating gate is hot electron injection, and voltage switching circuitry (not shown) uses the programming voltage supply VPP to generate a gate voltage and a drain voltage to apply to the selected flash cell during programming pulses. The source of the selected flash cell is typically grounded during programming. The control engine 510 sets the threshold voltage $V_t$ of the selected cell by applying a series of programming pulses during each of which the programming voltages derived from the programming voltage supply VPP are applied to and removed from the selected flash cell. It is possible that a selected flash cell can successfully program in one programming pulse. The amount of charge placed within the selected cell is varied by varying the gate or wordline voltage level during programming pulses.

During the write access, the MLC address line 70 is used to route the 16-bit encoded data into the high or low order word. As can be seen, the added address line 70 is coupled as an input to AND gates 520 and 525. The address bit is inverted for the AND gate 520. The second input for each AND gate is the output of the control engine. Depending on the state of the MLC address line 70, a logic 1 output by the control engine 510 will cause either FET 530 or 535 to be switched on, coupling the programming voltage VPP to selected flash cells 30 and 35, respectively. If the address bit is high, the high order word (the odd-numbered data blocks) will be programmed. The control engine for each write path determines the programming level of the selected flash cell.

Figure 7:
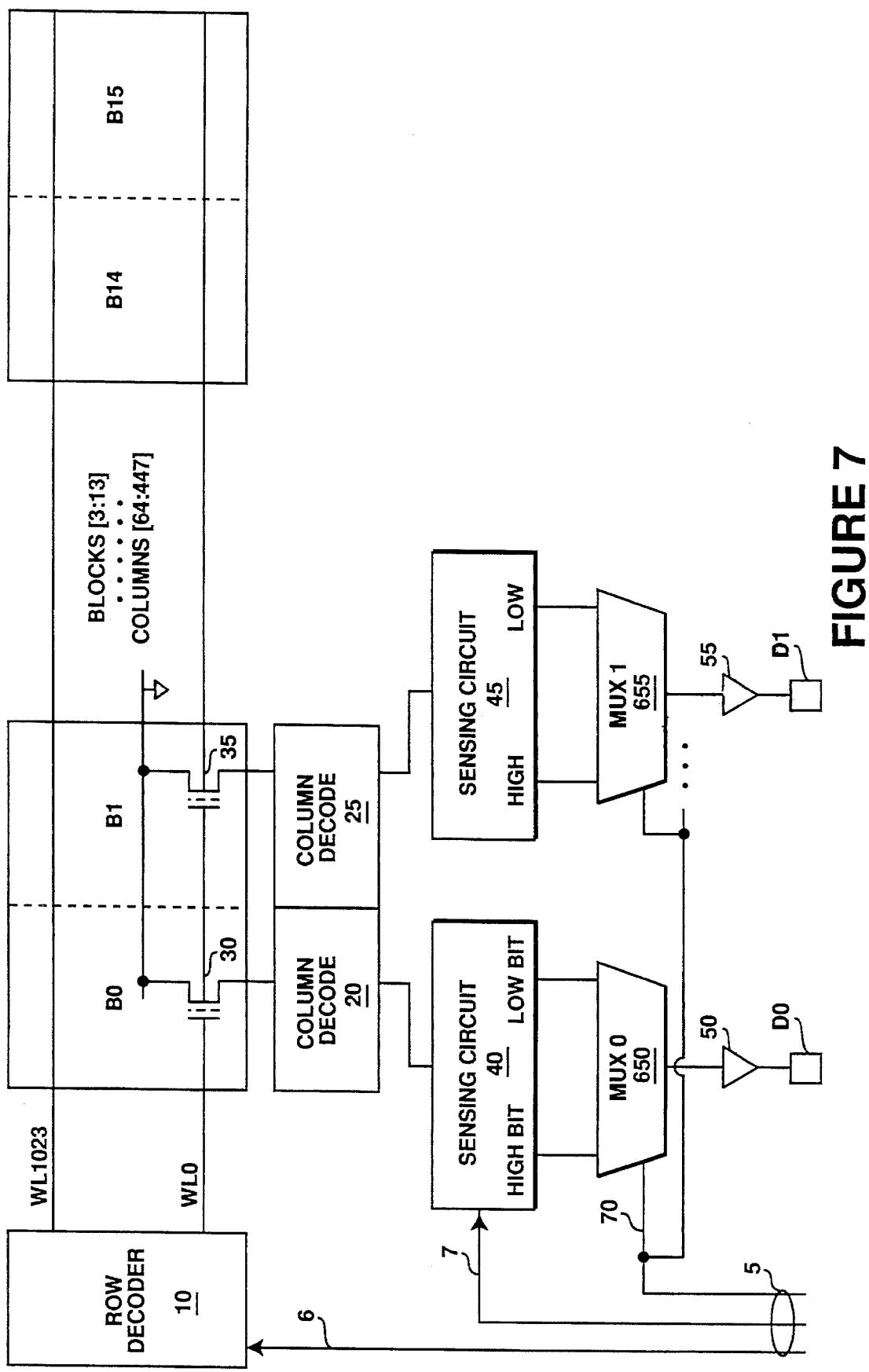
FIG. 7 shows a by-address sense path architecture.

FIG. 7 illustrates a by-address sense path architecture according to one embodiment. The drain of the selected flash cell 30 is coupled to the sense path circuit of data block B0 via column decoder 20. The drain of the selected flash cell 35 is coupled to the sense path circuit of data block B1 via column decoder 25. The sense path for data block B0 includes sensing circuit 40, switching circuit 650 and output buffer 50. In this sense path architecture, one address is provided for each bit stored in the multi-bit flash cell, and the mapping of data blocks to outputs maintains the one-to-one correspondence of the prior art single-bit flash cell array. Thus, in this embodiment, there are 16 data blocks, B0–B15, containing 32 columns each, mapped to 16 outputs, D0–D15. Addresses are provided via address lines 5.

During a read access, when a dual-bit flash cell 30 is selected by row decoder 20 and column decoder 10, the drain of the selected flash cell 30 is coupled to sensing circuit 40, which is preferably the sensing circuit shown in FIG. 5. Switching circuit 650, which may be a 2:1 multiplexer, selects either the high order Bit 1 or the low order Bit 0 in response to the MLC address signal that is received by MLC address line 70. The MLC address line 70 is routed to each multiplexer for each sense path. The number of bits for the MLC address line 70 is determined by the increase in memory space, as detailed above with respect to the by output sense path architecture. For this embodiment, where n is equal to 2, the MLC address line 70 is preferably a single binary bit wide.

During a first cycle of the read access the MLC address line 70 assumes a first state, routing the high bit to the output buffer 671. During the second cycle of the read access, the MLC address line 70 assumes a second state, routing the low bit to the output buffer 50. Of course, the order in which the high bit and the low bit are output may be reversed. Also, each bit stored in a flash cell may be individually addressed, and a two step read process is not required. The sense path circuit for data block B1 operates substantially identically to the sense path circuit for data block B0 and is shown to more distinctly demonstrate the differences between the by-output and by-address sense path architectures. The sense path for data block B1 includes sensing circuit 45, switching circuit 655 and output buffer 55.

Figure 8:
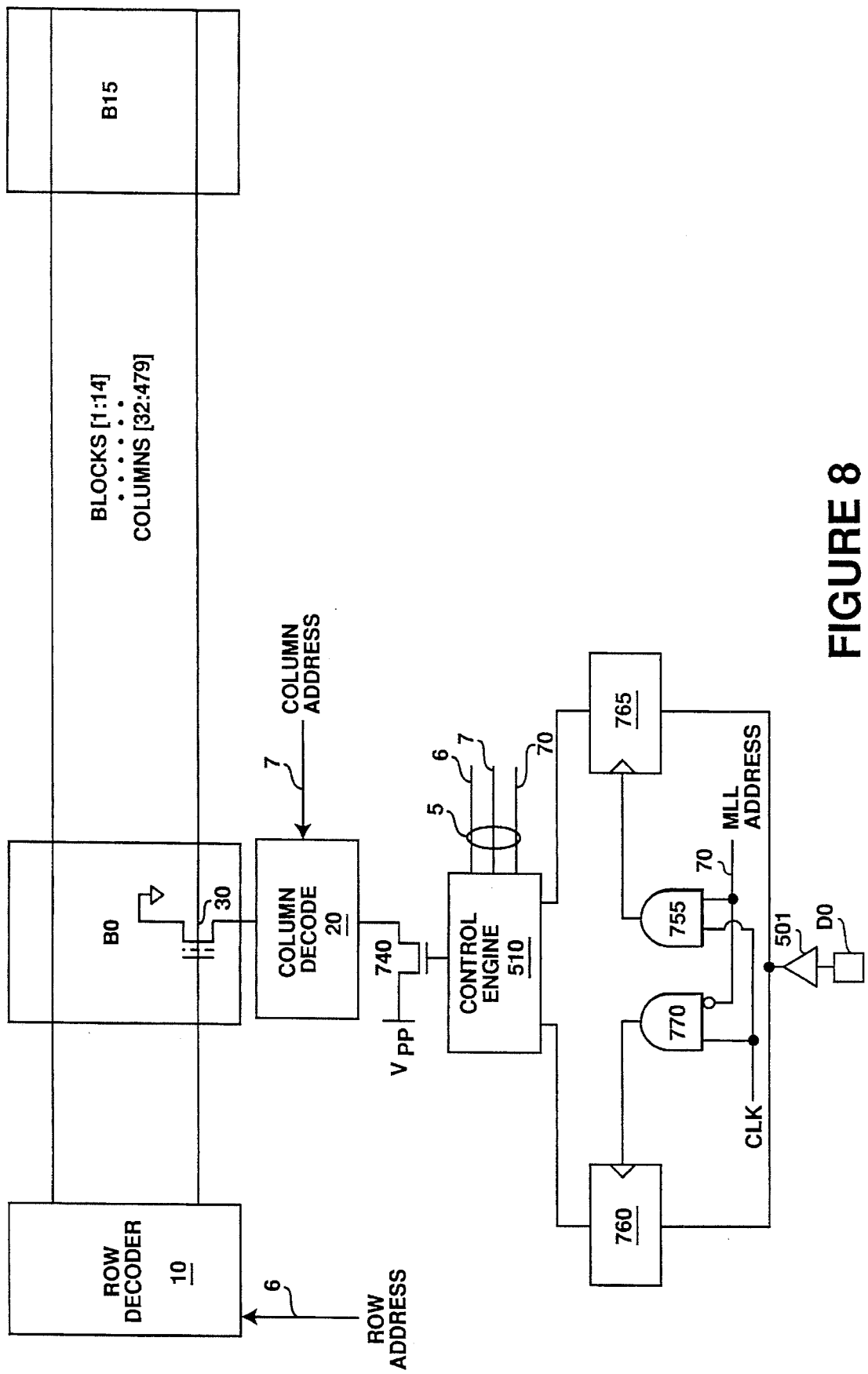
FIG. 8 shows a by-address write path architecture.

FIG. 8 shows a by-address write path architecture. The drain of the selected flash cell 30 is coupled to the write path circuit via column decoder 20. The write path circuit includes n-channel FET 740, control engine 510, latches 760 and 765, and AND gates 770 and 775. Again, the function of the control engine 510 can be performed by circuitry external to the memory device. Similar write path circuits are provided for each output. The drain of n-channel FET 740 is coupled to the programming voltage supply VPP while it source is coupled to the drain of selected flash cell 30 via the column decoder 20. FET 740 is switched on and off in response to a programming signal generated by the control engine 510 and received at the gate of FET 740.

During a write access two external 16 bit words from two sequential addresses are latched into thirty two data latches. Alternatively, a single thirty-two bit register may be used. When the CLK signal goes high and the MLC address bit is low, the bit at the output D0 is latched into latch 760. On the next clock cycle when the CLK signal goes high and the address bit goes high, the bit at the output D0 is latched into latch 765. The control engine codes these two bits into one of four programming levels and switches n-channel FET 740 on and off to program the selected cell 730. The encoding may be done as shown in Table 1, above. When a flash cell is selected, the high bit of the flash cell is accessed by a first output, and the low bit of the flash cell is accessed by a second output.

Figure 9:
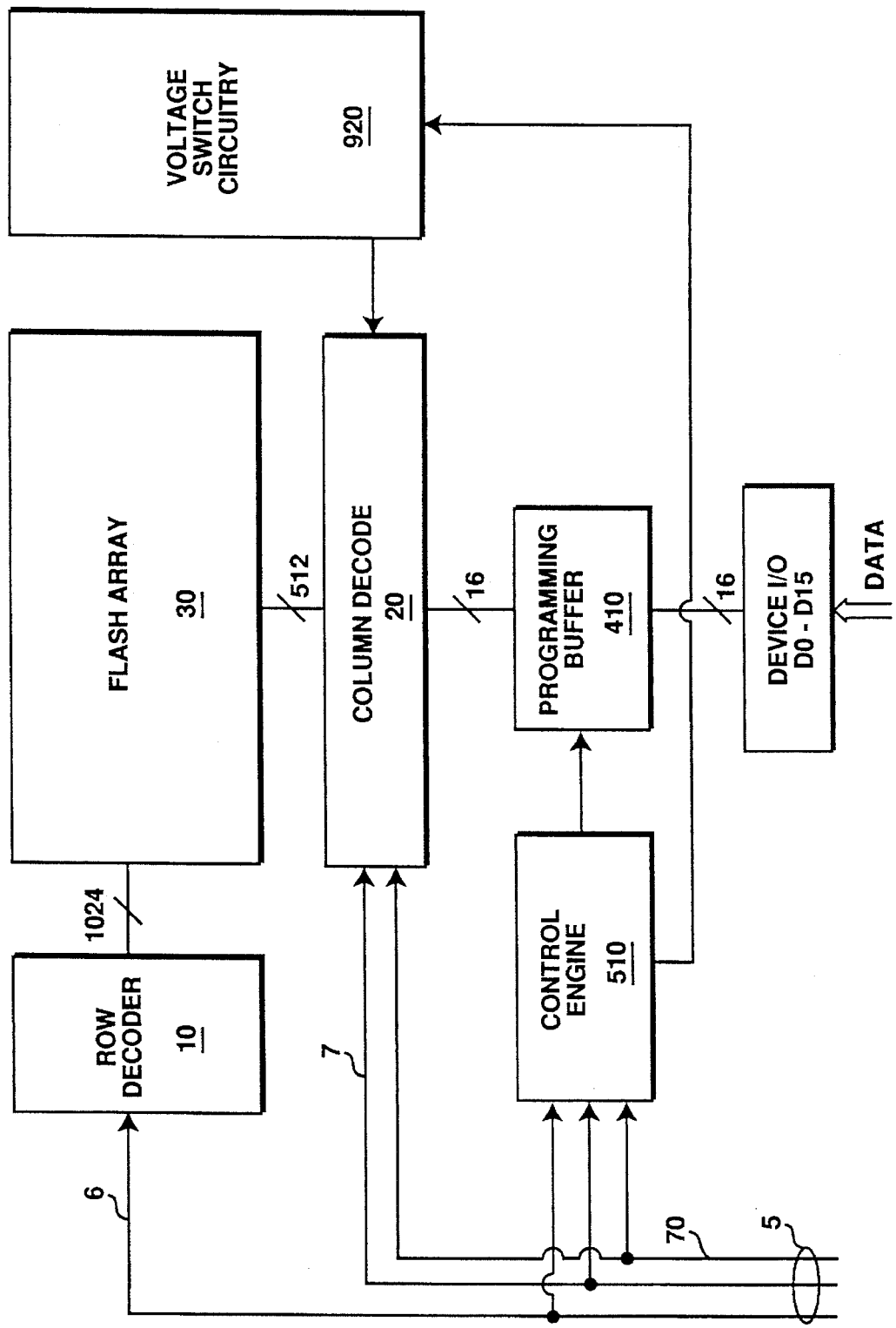
FIG. 9 shows an alternative write path architecture that may implement either by-address or by-output addressing schemes.

FIG. 9 shows an alternative write path architecture that can implement either by-address or by-output addressing schemes. Again, the flash cells of flash array 30 are selected by row decode circuit 10 and column decode circuits 20 in response to addresses provided via address lines 5. The write path circuitry as shown includes a programming buffer 910 and voltage switch circuitry 920. Programming buffer 910 is used to buffer data received via device I/O pins D0–D15. The use of a programming buffer increases programming throughput to the flash cell array 30. The programming buffer enables increased programming speed by buffering a set of programming data. The programming buffer enables fast access to the programming data by the control engine 510. The fast access to the programming data enables the control engine 510 to amortize the cycling of program level voltages via voltage switch circuitry 920 across multiple bytes in the flash cell array 30.

Control engine 510 controls the loading of programming buffer 910 with programming data in response to the incoming addresses received via address lines 5. Several bytes or words of data can be stored in the programming buffer 910. To program the flash array 30, the control engine causes the programming buffer 910 to read out the programming data to the column decode circuits 20 while simultaneously supplying the appropriate address information to the row decode circuit 10 and column decode circuits 20 via address lines 5. The control engine 510 applies programming pulses to the selected flash cells of the flash array by controlling voltage switching circuitry 920. In response, voltage switching circuitry 920 provides the appropriate voltages to the drains and the select gates of the selected flash cells of the flash array 30. The data stored in the selected flash cells is verified between each programming pulse using the appropriate sense path architecture.

The control engine 510 controls the loading and unloading of the programming buffer 920 in response to the addressing scheme implemented by the write and read path architectures, and the control engine 510 may be designed or programmed to support either or both of the addressing schemes described. Thus, the write path architecture of FIG. 9 is flexible and may be implemented on a memory device such that the user ultimately selects between by-output and by-address options by selecting the addressing scheme.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. In a flash electrically erasable programmable read-only memory circuit, a sense path circuit for selectively accessing data stored in one of a plurality of data blocks, each data block including at least one memory cell that stores n bits, wherein n is greater than 1, the sense path circuit comprising:

a plurality of n outputs;

a row decoder circuit coupled to the data blocks;

a first column decode circuit coupled to a first memory cell of a first data block for addressing the first memory cell in conjunction with the row decoder circuit in response to an address;

a second column decode circuit coupled to a first memory cell of a second data block for addressing the first memory cell of the second data block in conjunction with the row decoder circuit in response to the address;

a sensing circuit for determining each of the n bits stored in a selected memory cell and for outputting each of the n bits to a corresponding one of the n outputs; and a selector circuit for selectively coupling either the first memory cell of the first data block or the first memory cell of the second data block to the sensing circuit in response to a select signal.

2. The sense path circuit of claim 1, wherein the select signal is one bit wide.

3. The sense path circuit of claim 1, wherein the selected memory cell is a nonvolatile memory cell.

4. A flash electrically erasable programmable read-only memory device comprising:

a plurality of inputs including row address inputs, column address inputs, and at least one select input;

a memory cell array arranged in a plurality of rows and columns, the memory cell array comprising a plurality of m data blocks, each data block comprising a plurality of memory cells, wherein each memory cell is operative to store n bits of data, wherein n is greater than 1;

a row decoder circuit coupled to the plurality of m data blocks, wherein the row decoder circuit selects a row of the memory cell array in response to a row address received via the row address inputs;

a plurality of m column decoder circuits each coupled to a corresponding one of the plurality of m data blocks, wherein each column decoder circuit selects a column of the corresponding data block in response to a column address received via the column address inputs such that m memory cells are selected for reading in response to the row and column addresses;

a plurality of m/n sensing circuits each for determining the n bits of one of n selected memory cells;

a plurality of m outputs coupled to the plurality of sensing circuits for outputting data sensed by the plurality of sensing circuits; and a selector circuit coupled to the plurality of column decoder circuits and the plurality of sensing circuits for selectively coupling m/n of the m selected memory cells to the plurality of m/n sensing circuits in response to a selected signal carried by the select input.

\* \* \* \* \*

UNITED STATES PATENT AND TRADEMARK OFFICE
CERTIFICATE OF CORRECTION

PATENT NO. : 5,497,354

DATED : March 5, 1996

INVENTOR(S) : Sweha et al.

It is certified that error appears in the above-identified patent and that said Letters Patent is hereby corrected as shown below:

In column 10 at line 12 delete "510" and insert --750--

In column 12 at line 36 delete "decoder circuits" and insert --decoders--

Signed and Sealed this

Twenty-ninth Day of October 1996

Attest:

BRUCE LEHMAN

Attesting Officer

Commissioner of Patents and Trademarks